(12) United States Patent
Ahmed et al.

(10) Patent No.: US 9,076,651 B1
(45) Date of Patent: Jul. 7, 2015

(54) GATE STACKS AND OHMIC CONTACTS FOR SIC DEVICES

(71) Applicant: Intermolecular, Inc., San Jose, CA (US)

(72) Inventors: Khaled Ahmed, Anaheim, CA (US); Frank Greer, Pasadena, CA (US); Raj Jammy, San Ramon, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/136,271

(22) Filed: Dec. 20, 2013

(51) Int. Cl.
| | |
|---|---|
| H01L 21/302 | (2006.01) |
| H01L 21/461 | (2006.01) |
| H01L 21/3205 | (2006.01) |
| H01L 21/4763 | (2006.01) |
| H01L 21/02 | (2006.01) |
| H01L 29/40 | (2006.01) |

(52) U.S. Cl.
CPC .... *H01L 21/02301* (2013.01); *H01L 21/02307* (2013.01); *H01L 21/02315* (2013.01); *H01L 21/0228* (2013.01); *H01L 29/401* (2013.01)

(58) Field of Classification Search
USPC .......................................... 438/694, 745–757
See application file for complete search history.

(56) References Cited

U.S. PATENT DOCUMENTS

| | | | | |
|---|---|---|---|---|
| 6,610,615 | B1 * | 8/2003 | McFadden et al. | 438/776 |
| 7,645,710 | B2 * | 1/2010 | Olsen et al. | 438/783 |
| 8,110,490 | B2 * | 2/2012 | Yeh et al. | 438/591 |
| 8,685,815 | B2 * | 4/2014 | Ahn et al. | 438/216 |
| 2003/0232491 | A1 * | 12/2003 | Yamaguchi | 438/591 |
| 2004/0232499 | A1 * | 11/2004 | Ryoo | 257/410 |
| 2004/0242021 | A1 * | 12/2004 | Kraus et al. | 438/776 |
| 2005/0136580 | A1 * | 6/2005 | Colombo et al. | 438/197 |
| 2005/0269635 | A1 * | 12/2005 | Bojarczuk et al. | 257/338 |
| 2007/0134821 | A1 * | 6/2007 | Thakur et al. | 438/5 |
| 2009/0017603 | A1 * | 1/2009 | Yang | 438/503 |
| 2010/0065855 | A1 * | 3/2010 | Yokoyama et al. | 257/76 |
| 2012/0094011 | A1 * | 4/2012 | Hishiya et al. | 427/8 |

OTHER PUBLICATIONS

Veloso et al.; Highly Scalable Effective Work Function Engineering Approach for Multi-VT Modulation of Planar and FinFET-based RMG High-k Last Devices for (Sub-)22nm Nodes; 2013; 2013 Symposium on VLSI Technology Digest of Technical Papers; 2 pages.
Park et al.; Robust Ternary Metal Gate Electrodes for Dual Gate CMOS Devices; 2001; IEEE; pp. 30.6.1-30.6.4.
Kim et al.; Comparison of TiN and TiAlN as a Diffusion Barrier Deposited by Atomic Layer Deposition; Jan. 2002; Journal of the Korean Physical Society, vol. 40, No. 1; pp. 176-179.

(Continued)

*Primary Examiner* — Karen Kusumakar

(57) ABSTRACT

SiC substrates are cleaned and provided to a process chamber. In-situ plasma surface treatments are applied to further clean the surface of the substrate. A dielectric interface layer is deposited in-situ to passivate the surface. Metal layers having a low work function are deposited above the dielectric interface layer. The stack is annealed at about 500C in forming gas to form low resistivity ohmic contacts to the SiC substrate. SiC substrates are cleaned and provided to a process chamber. In-situ plasma surface treatments are applied to further clean the surface of the substrate. A silicon oxide dielectric interface layer is deposited in-situ to passivate the surface. Optional plasma surface treatments are applied to further improve the performance of the silicon oxide dielectric interface layer. An aluminum oxide gate dielectric layer is deposited above the silicon oxide dielectric interface layer.

20 Claims, 6 Drawing Sheets

(56) References Cited

OTHER PUBLICATIONS

Koo et al.; Study on the characteristics of TiAlN thin film deposited by atomic layer deposition method; Nov./Dec. 2001; Journal of Vacuum Science and Technology A, vol. 19, No. 6; American Vacuum Society; pp. 2831-2834.

Machac et al.; Sputtering of Ni/Ti/SiC ohmic contacts; May 22, 2008; Microelectronic Engineering; Elsevier B.V.; pp. 2016-2018.

Jamet et al.; Physical properties of N2O and NO-nitrided gate oxides grown on 4H SiC; Jul. 16, 2001; Applied Physics Letters, vol. 79, No. 3; American Institute of Physics; pp. 323-325.

Jamet et al.; Effects of nitridation in gate oxides grown on 4H-SiC; Nov. 15, 2001; Journal of Applied Physics, vol. 90, No. 10; American Institute of Physics; pp. 5058-5063.

Ueno et al.; H2 surface treatment for gate-oxidation of SiC metal-oxide-semiconductor field effect transisitsors; 1999; Materials Science and Engineering B61-62; Elsevier Science S.A.; pp. 472-474.

Lazar et al.; Characteristics of metalorganic remote plasma chemical vapor deposited Al2O3 gate stacks on SiC metal-oxide-semiconductor devices; Aug. 13, 2001; Applied Physics Letters, vol. 79, No. 7; American Institute of Physics; pp. 973-975.

\* cited by examiner

GATE STACKS AND OHMIC CONTACTS FOR SIC DEVICES

TECHNICAL FIELD

The present disclosure relates generally to methods and apparatuses for forming gate stacks and ohmic contacts in the manufacture of silicon carbide based microelectronic devices.

BACKGROUND

Field effect transistor (FET) devices based on using silicon carbide (SiC) as the semiconductor material are widely used in power applications, high temperature applications, and high frequency applications. SiC has a wide band gap, high breakdown field, high saturation velocity, and high electron mobility. SiC also has a beneficial characteristic in that high quality silicon oxide dielectric layers can be grown on the surface of the SiC (e.g. similar to the growth of high quality silicon oxide on silicon). However, the growth of the silicon oxide layer releases free carbon from the SiC semiconductor and/or incorporates carbon contamination into the silicon oxide layer. Both of these phenomena result in decreased device performance.

Another issue regarding the development and manufacture of FET devices based on SiC involves the formation of high quality ohmic contacts to the SiC material. Typically, metals such as nickel are used in the contact materials. The substrates must be heated to temperatures in the range of about 950C to about 1000C to form low resistivity nickel silicides. This high thermal budget may degrade the device performance and lead to poor reliability and poor durability.

Many problems arise in fabricating working devices using SiC semiconductors described above. Defects at the semiconductor-dielectric interface can propagate and lead to lower device performance. Further, the aggregation of free carbon at the interface can present a challenge in both the gate stack and in forming low resistivity ohmic contacts to the semiconductor material.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, SiC substrates are cleaned and provided to a process chamber. In-situ plasma surface treatments are applied to further clean the surface of the substrate. A dielectric interface layer is deposited in-situ to passivate the surface. Metal layers having a low work function are deposited above the dielectric interface layer. The stack is annealed at about 500C in forming gas to form low resistivity ohmic contacts to the SiC substrate.

In some embodiments, SiC substrates are cleaned and provided to a process chamber. In-situ plasma surface treatments are applied to further clean the surface of the substrate. A silicon oxide dielectric interface layer is deposited in-situ to passivate the surface. Optional plasma surface treatments are applied to further improve the performance of the silicon oxide dielectric interface layer. An aluminum oxide gate dielectric layer is deposited above the silicon oxide dielectric interface layer.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
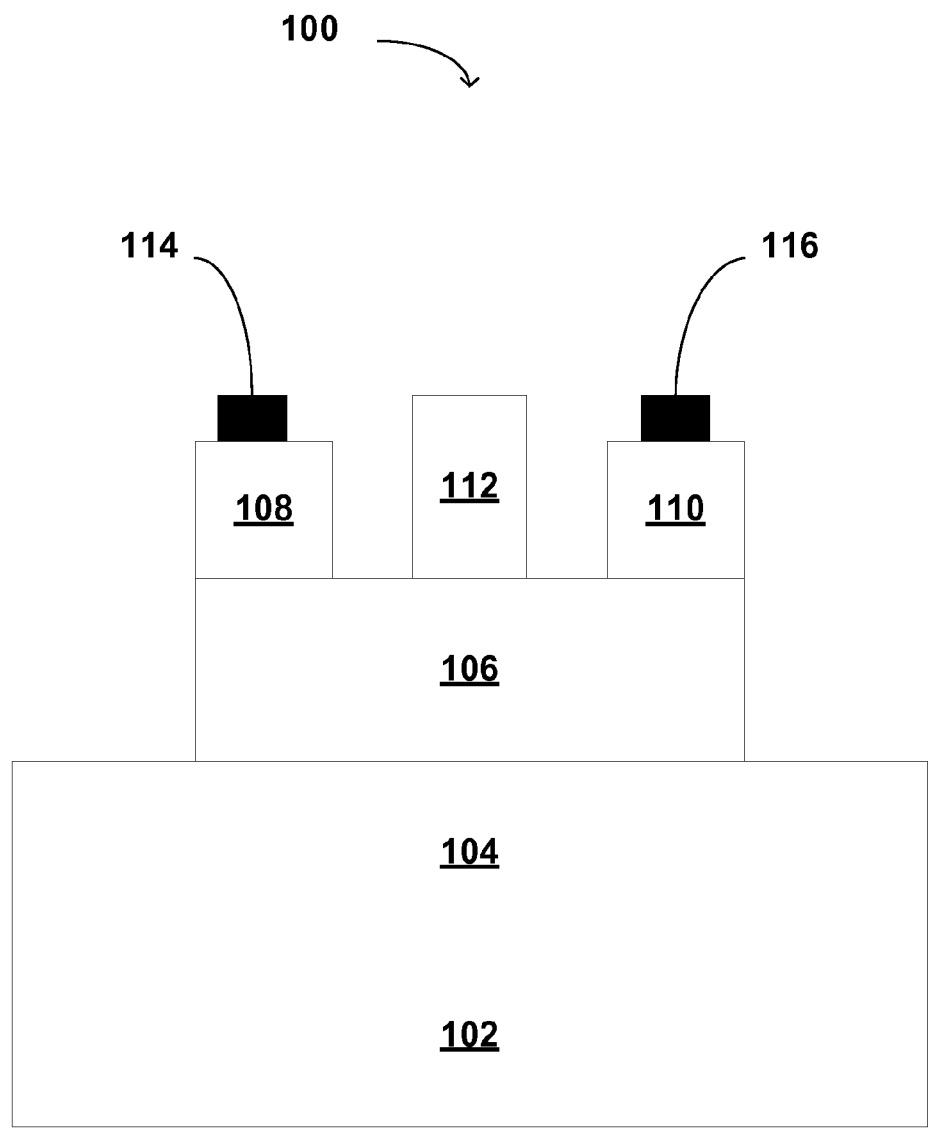
FIG. 1 illustrates a cross-sectional schematic diagram of a typical semiconductor device.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "an," and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially equal to" or "substantially the same" is used, the two quantities may vary from each other by no more than 5%.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

The term "substrate" as used herein may refer to any workpiece on which formation or treatment of material layers is desired. Substrates may include, without limitation, silicon, germanium, silicon-germanium alloys, gallium arsenide, indium gallium arsenide, indium gallium antimonide, silica, sapphire, zinc oxide, silicon carbide, aluminum nitride, Spinel, coated silicon, silicon on oxide, silicon carbide on oxide, glass, gallium nitride, indium nitride, and combinations (or alloys) thereof. The term "substrate" or "wafer" may be used interchangeably herein. Semiconductor wafer shapes and sizes can vary and include commonly used round wafers of 50 mm, 100 mm, 150 mm, 200 mm, 300 mm, or 450 mm in diameter.

Those skilled in the art will appreciate that each of the layers discussed herein may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the device structure, ALD, PE-ALD, AVD, or CVD are preferred methods of formation. However, any of these techniques are suitable for forming each of the various layers discussed herein. Those skilled in the art will appreciate that the teachings described herein are not limited by the technology used for the deposition process.

A brief description of generic semiconductor device examples is presented below to provide better understanding of various processes. Specifically, FIG. 1 illustrates a schematic representation of substrate portions including a SiC FET device, 100, in accordance with some embodiments. FET device 100 includes a high resistivity SiC substrate, 102, and an undoped SiC buffer layer, 104, deposited above the substrate. Substrate, 102, is typically a part of an overall wafer that may include other devices. Some of these devices may include silicon nitride, silicon oxide, polysilicon, or titanium nitride structures. An n-SiC active layer, 106, is deposited above the undoped SiC buffer layer.

FET device, 100, also includes a conductive gate electrode, 112. Gate electrode, 112, may include any suitable conductive material. In some embodiments, gate electrode, 112, may comprise polysilicon.

FET device, 100, also includes n+ source region, 108, and n+ drain region, 110, (or simply the source and drain) deposited on n-SiC active layer, 106. Source region, 108, and drain region, 110, are located on each side of gate electrode, 112. Source region, 108, and drain region, 110, may be formed by ion implantation. Source contact, 114, and drain contact, 116, are deposited on the respective source region and drain region. Material selection and process conditions are chosen such that a contact having low resistivity is formed between the source and drain contacts and the respective source and drain regions.

Figure 2:
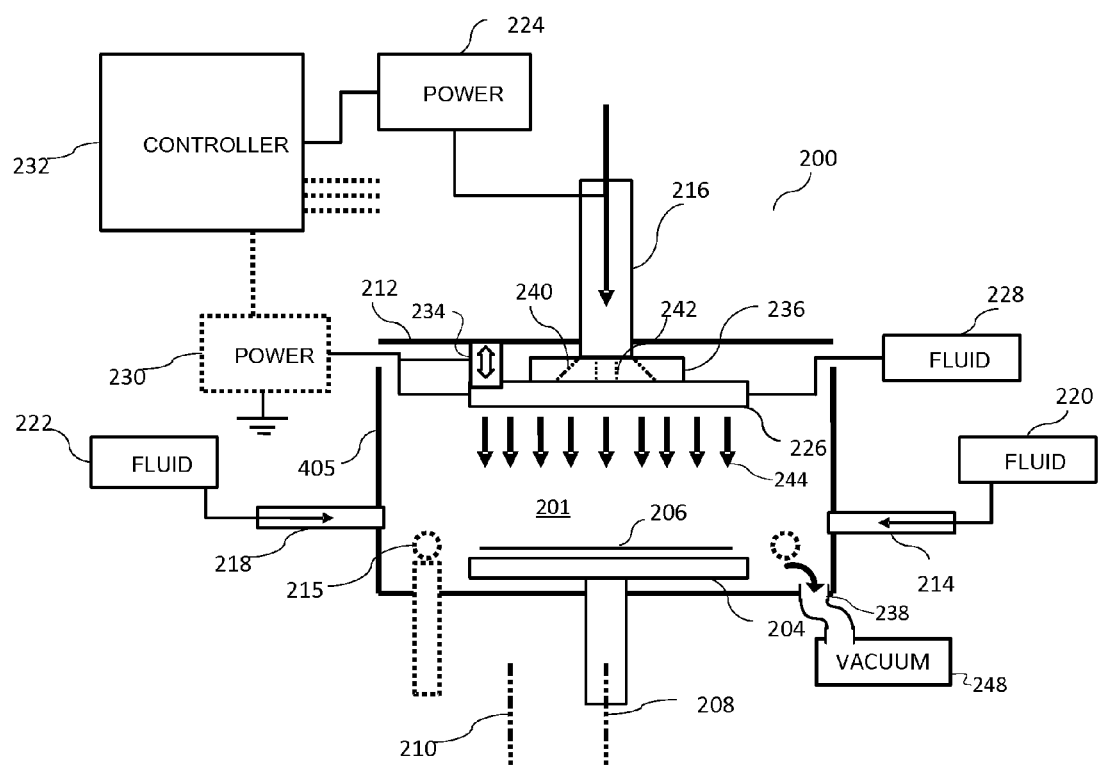
FIG. 2 illustrates a processing system enabling atomic layer deposition according to some embodiments.

FIG. 2 is a simplified schematic diagram illustrating a processing chamber, or substrate processing tool configured to perform ALD. In the interest of brevity, the illustration presented in FIG. 2 includes hardware for both thermally activated ALD as well as PEALD. The processing chamber 200 is defined by a housing that includes a sidewall 205 and a lid 212 enclosing a chamber interior 201. Processing chamber 200 also includes a substrate support 204 configured to hold a substrate 206. The substrate support 204 may be any known substrate support, including but not limited to a vacuum chuck, electrostatic chuck or other known mechanisms. The substrate support 204 may include the ability to heat the substrate to a temperature between about 100C and about 650C. In those embodiments wherein thermally activated ALD processes are implemented, the heating from the substrate support provides the energy for the precursor and reactant gases to react and form the film on the surface of the substrate. The substrate support 204 is capable of both rotating around its own central axis 208 (referred to as "rotation" axis, which is congruent with a central axis of the substrate 206), and rotating around a second axis 210 (referred to as "revolution" axis). Other substrate supports, such as an X-Y table, can also be used for moving the substrate. In addition, the substrate support 204 may move in a vertical direction, (i.e., away from or towards lid 212). Rotation, and movement in the vertical direction may be achieved through known drive mechanisms which include magnetic drives, linear drives, worm screws, lead screws, a differentially pumped rotary feed through drive, etc. A power source 224 provides power to plasma generation source 216 (e.g. for PEALD implementations). It should be appreciated that power source 224 may include a direct current (DC) power supply, a pulsed DC power supply, or a radio frequency (RF) power supply.

The substrate 206 may be a conventional round 200 mm, 300 mm, 450 mm substrate, or any other larger or smaller substrate/wafer size. In some embodiments, the substrate 206 may be a square, rectangular, or other shaped substrate. One skilled in the art will appreciate that the substrate 206 may be a blanket substrate, a coupon (e.g., partial wafer), or even a patterned substrate having predefined regions. In some embodiments, the substrate 206 may have regions defined through the processing described herein.

The chamber 200 in FIG. 2 includes a lid 212, through which plasma generation source (or system) 216 extends (e.g. for PEALD implementations). Fluid inlets 214 and 218 extend into chamber interior 201 through sidewalls (or a base) 205 of the chamber 200. Fluid inlet 214 is in fluid communication with fluid source 220, while fluid inlet 218 is in fluid communication with fluid source 222. In other embodiment, fluid inlets 214 and 218 may be in fluid communication with the same fluid source. It should be appreciated that fluid inlets 214 and 218 may extend around a surface of the substrate 206 so that a perimeter of substrate 206 is encompassed by fluid inlets 214 and 218. In some embodiments, fluid inlets 214 and 218 are configured as ring portions surrounding substrate 206.

In some embodiments, fluid inlets 214 and 218 are movable to vertically translate along with the substrate support 204 so that each fluid inlet remains proximate to an edge of substrate 206. For example, the ring portions may be coupled to an appropriate drive such as a worm gear, linear drive, etc., so that the fluid inlets 214 and 218 track the movement of the substrate and substrate support.

The plasma generation source 216 is operable to provide a plasma activated species. "Plasma activated species" refers to reactive atomic and molecular radicals converted from the precursor gas (and/or the reactant gas) through interaction with the plasma. The plasma also consists of non-charged species (e.g., radicals) and charged species (e.g., ions and electrons). The plasma activated species provided by plasma generation source 216 may have a non-reactive outer portion 240 surrounding a reactive inner portion 242. Plasma generation source 216 may be a commercially available inductively coupled radio frequency (RF) plasma generation source.

Plasma activated species 240, 242 exit plasma generation source 216 through showerhead body 236 and into showerhead 226. Showerhead 226 diffuses the flow of plasma activated species through a number of injection ports into multiple paths 244. Some PEALD processes do not use showerheads. In the implementation of thermally activated ALD, the plasma activated species are not generated and the precursor gases, the purge gases, and the reactant gases are simply dispersed through the showerhead and onto the surface of the substrate. Showerhead body 236 and showerhead 226, as illustrated, are suspended in chamber interior 201 above substrate 206. Showerhead 226 and showerhead body 236 may be vertically translatable (i.e., movable) within chamber interior 201 by means of showerhead translator 234. Showerhead translator 234 may include any appropriate drive such as a worm gear, linear drive, etc., and may be operable to translate showerhead 226 dynamically as processing continues.

An additional fluid source 228 may be coupled to (i.e., in fluid communication with) showerhead 226. Fluid source 228 may provide, for example, an inert gas to the showerhead during processing. In some embodiments, the showerhead 226 is grounded. However, in other embodiments, a power supply (and controller) 230 may also be provided to control and modulate a charge on the showerhead 226 and/or control showerhead translator 234. Alternatively, showerhead translator 234 may be controlled by controller 232 and powered by power supply 224, or any other suitable source of power and control may be used.

To remove excess precursors, purge gases, reactant gases, waste products, and other fluids from chamber interior 201, one or more vacuum pumps 248 may be in fluid communication with chamber interior 201 via exhaust port 238. Exhaust port 238 may be located on any convenient or effective area of chamber 200. There may be multiple exhaust ports. In some embodiments, showerhead 226 or showerhead body 236 may have an independent exhaust port, for example to exhaust fluids introduced into showerhead 226 by fluid source 228. An exhaust may be a multi-port ring near the substrate (not shown) as a counterpart to distribution ring 215.

The chamber 200 also includes a controller (or control sub-system) 232 in operable communication with the other components of the chamber 200, such as fluid sources 220, 222, and 228, power supply 224, etc. (for drawing simplicity, not all connections are shown). The controller 232 may include a processor, memory such as random access memory (RAM), and a storage device such as a hard disk drive. The controller 232 is configured to control the operation of the chamber 200 to perform the methods and processes described herein.

Figure 3:
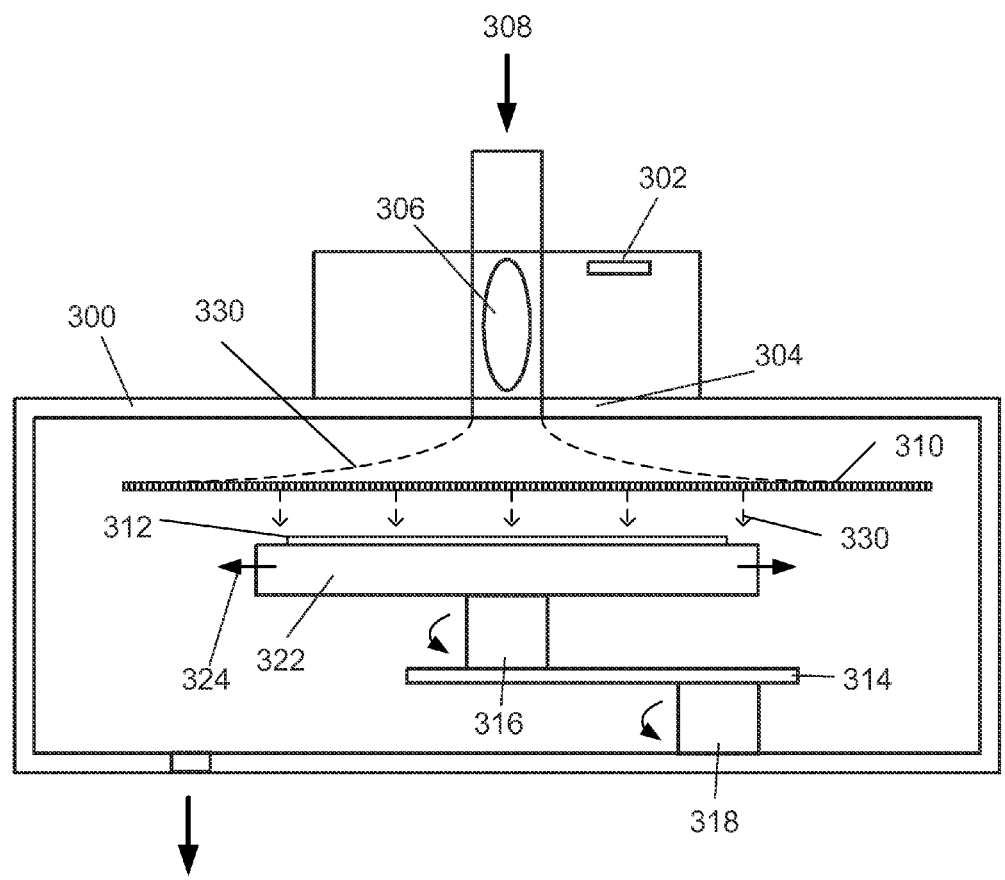
FIG. 3 illustrates a processing system enabling plasma surface treatment according to some embodiments.

FIG. 3 illustrates the overall layout of some embodiments of a system enabling a surface treatment using a remote plasma source. A process chamber, 300, is provided. A remote plasma source, 302, is mounted on a chamber lid, 304, either directly as illustrated or through a short flange. The plasma, 306, is entrained into a central gas flow, 308, which is directed toward a showerhead, 310. The showerhead is disposed within the processing chamber between the remote plasma source and the substrate and is in close proximity to the substrate, 312. The showerhead is operable to provide exposure of reactive species from the remote plasma source to deposit materials on the substrate. A substrate positioning system, 314, can position the substrate, 312, directly under the showerhead, 310. As illustrated in FIG. 3, the substrate positioning system can provide two displaced axes of rotation, 316, and 318. The two-axis rotation configuration illustrated can provide 360° of rotation for the upper rotation (providing an angular coordinate) and 60° of rotation for the lower axis (approximating a radial coordinate) to provide all possible substrate positions. Alternatively, other positioning systems such as X-Y translators can also be used. In addition, substrate support, 322, may move in a vertical direction. It should be appreciated that the rotation and movement in the vertical direction may be achieved through known drive mechanisms which include magnetic drives, linear drives, worm screws, lead screws, a differentially pumped rotary feed through drive, etc.

The substrate support, 322, can include a substrate heater (e.g., resistive or inductive) and can be sized to be larger than the largest substrate to be processed. Substrate temperatures for most surface treatment applications are less than 700 C, although any suitable heater power and range of temperature control. The substrate support, 322, can also be configured to provide a gas purge flow, 324, for example from the edges of the support, using argon, helium, or any other gas that is not reactive under the process conditions.

Plasmas are widely used for a variety of treatment and layer deposition tasks in semiconductor fabrication. These applications include subtractive processes such as wafer precleaning, contaminant removal, native oxide removal, photoresist removal, additive processes such as plasma enhanced deposition, and treatment processes such as oxidation, nitridation, or hydridation of a layer both during and after formation. "Remote" plasma sources are frequently used, where the plasma is located at some distance from the surface to be treated or substrate on which a layer is to be formed. The distance allows some adjusting of the charged particles in the plasma. For example, the density of ions and electrons can be adjusted by distance, the electrons and ions can be removed from the generated plasma using suitable electrode configurations such as a grounded metal showerhead, so that, for example, only atomic radicals and molecule radicals (but not ions) reach the substrate.

The plasma generator for a remote plasma source can use any known means of coupling energy into atoms or molecules to ionize them and create a plasma. The energy source can be, for example, electromagnetic energy such as microwaves, radio frequency energy, or lasers.

Figure 4:
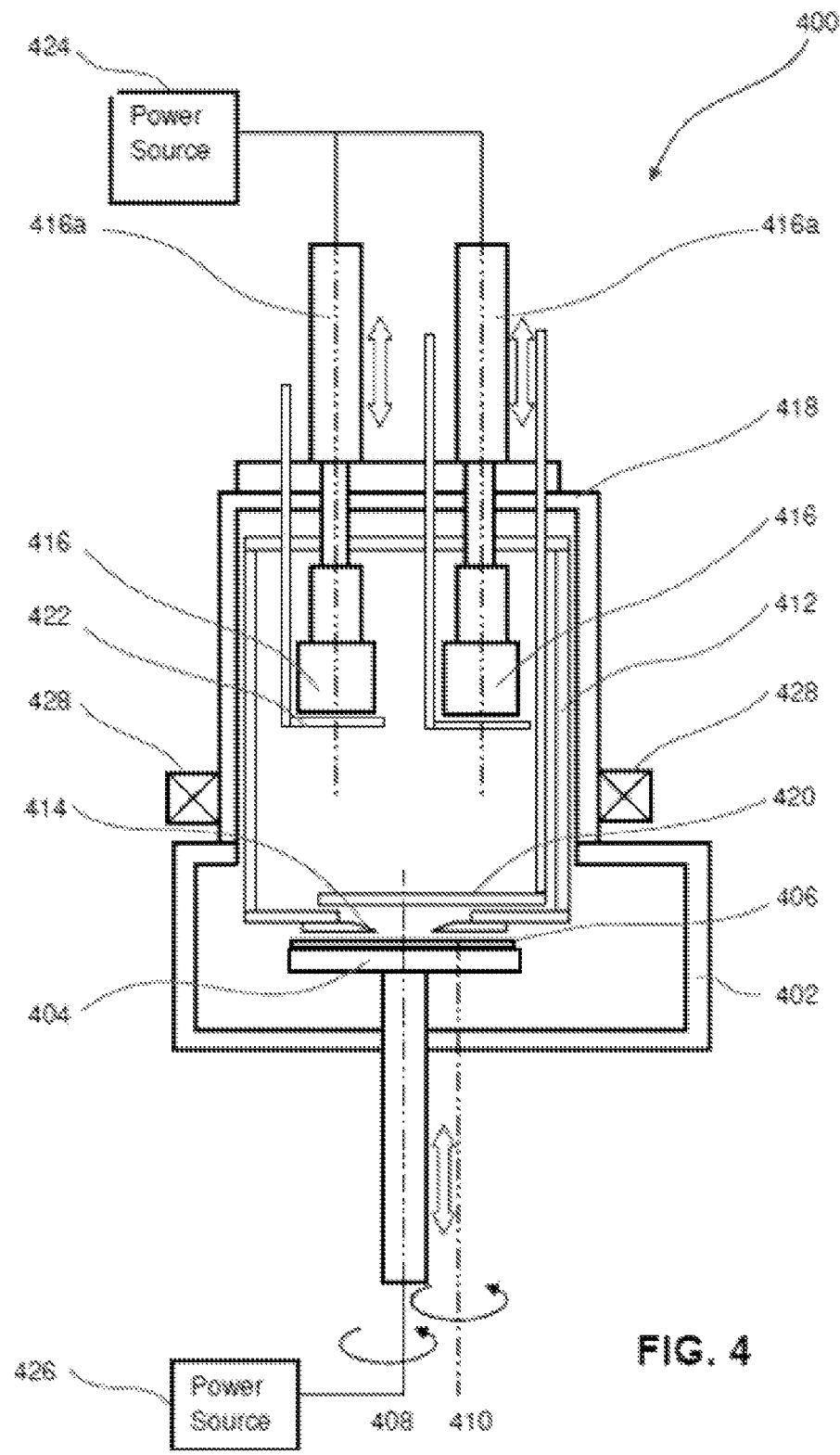
FIG. 4 illustrates a processing system enabling physical vapor deposition according to some embodiments.

FIG. 4 is a simplified schematic diagram illustrating an alternate sputter chamber configured to perform processing according to some embodiments. Processing chamber 400 includes a bottom chamber portion 402 disposed under top chamber portion 418. Within bottom portion 402, substrate support 404 is configured to hold a substrate 406 disposed thereon and can be any known substrate support, including but not limited to, a vacuum chuck, electrostatic chuck or other known mechanisms. Substrate support 404 is capable of both rotating around its own central axis 408 (referred to as "rotation" axis), and rotating around an exterior axis 410 (referred to as "revolution" axis). Other substrate supports, such as an X-Y table, can also be used. In addition, substrate support 404 may move in a vertical direction. It should be appreciated that the rotation and movement may be achieved through known drive mechanisms which include magnetic drives, linear drives, worm screws, lead screws, a differentially pumped rotary feed through drive, etc. Power source 426 provides a bias power to substrate support 404 and substrate 406, and produces a bias voltage on substrate 406. Substrate 406 can be a conventional round 200 mm, 300 mm, 450 mm, or any other larger or smaller substrate/wafer size. In some embodiments, substrate 406 can be square, rectangular, or any other suitable shape. One skilled in the art will appreciate that substrate 406 can be a blanket substrate, a coupon (e.g., partial wafer), or even a patterned substrate having predefined regions.

Top chamber portion 418 of chamber 400 in FIG. 4 includes shield 412, which defines a confinement region over a radial portion of substrate 406. Shield 412 is a sleeve having a base (optionally integrated with the shield) and an optional top within chamber 400 that can be used to confine a plasma generated therein. The generated plasma dislodges atoms from a sputtering target (causing material to be ejected from the sputtering target) and the sputtered atoms are deposited on a region of the substrate 406. Deposition can be performed in an inert gas atmosphere (e.g., an argon carrier gas) to deposit materials such as pure metals, or in the presence of reactive gases such as nitrogen or oxygen to deposit molecules such as metal oxides or metal nitrides. Neutral atoms or molecules (optionally in an excited electronic state) can be deposited. Alternatively, ions can be deposited, in which case a substrate bias voltage can be used advantageously to tune the energy of the ions arriving at the site-isolated region. Chamber pressure and gas flow rates can be adjusted to control the process; for example, the stoichiometry of layers formed in a reactive atmosphere can be tuned by adjusting the relative flow rate of the reactive gas(es).

Shield 412 is capable of being moved in and out of chamber 400, (i.e., the shield is a replaceable insert). Shield 412 includes an optional top portion, sidewalls and a base. In some embodiments, shield 412 is configured in a cylindrical shape, however, the shield may be any suitable shape and is not limited to a cylindrical shape.

The base of shield 412 includes an aperture 414 through which a region of the surface of substrate 406 (or the entire substrate) is exposed for deposition or some other suitable semiconductor processing operations.

A sputtering source shutter, 422 can also be included. Sputtering source shutter 422 functions to seal off a deposition source when the deposition source may not be used for the processing in some embodiments. For example, two sputtering sources 416 are illustrated in FIG. 4. Sputtering sources 416 are moveable in a vertical direction so that one or both of the sources can be lifted from the slots of the shield. While two sputtering sources are illustrated, any number of sputtering sources can be included, constrained only by space limitations, (e.g., one, three, four or more sputtering sources can be included). Typical embodiments for combinatorial processing can include 4 to 6 sputtering sources. Where more than one sputtering source is included, the plurality of sputtering sources may be referred to as a cluster of sputtering sources. Sputtering source shutter 422 can be moved to isolate the lifted sputtering sources from the processing area defined within shield 412. In this manner, the sputtering sources can be isolated from certain processes when desired. It should be appreciated that sputtering source shutter 422 can be integrated with the top of the shield 412 to cover the opening as the sputtering source is lifted or a sputtering source shutter 422 can be used for each site-isolated region.

Top chamber portion 418 of chamber 400 of FIG. 4 includes sidewalls and a top plate which house shield 412. Arm extensions 416a, which are fixed to sputtering sources 416 can be attached to a suitable drive, (e.g., lead screw, worm gear, etc.), configured to vertically move sputtering sources 416 toward or away from a top plate of top chamber portion 418. In typical use for high deposition rate sputtering, the sputtering target is positioned such that the target-to-substrate spacing is from about 20 mm to about 100 mm from the substrate, which is much closer than the typical spacing of 80-300 mm used in most sputtering systems. In some embodiments, the target-to-substrate spacing is from about 50 mm to about 75 mm. A larger spacing can reduce the deposition rate while a smaller spacing can make it difficult to strike and sustain the plasma.

Figure 5:
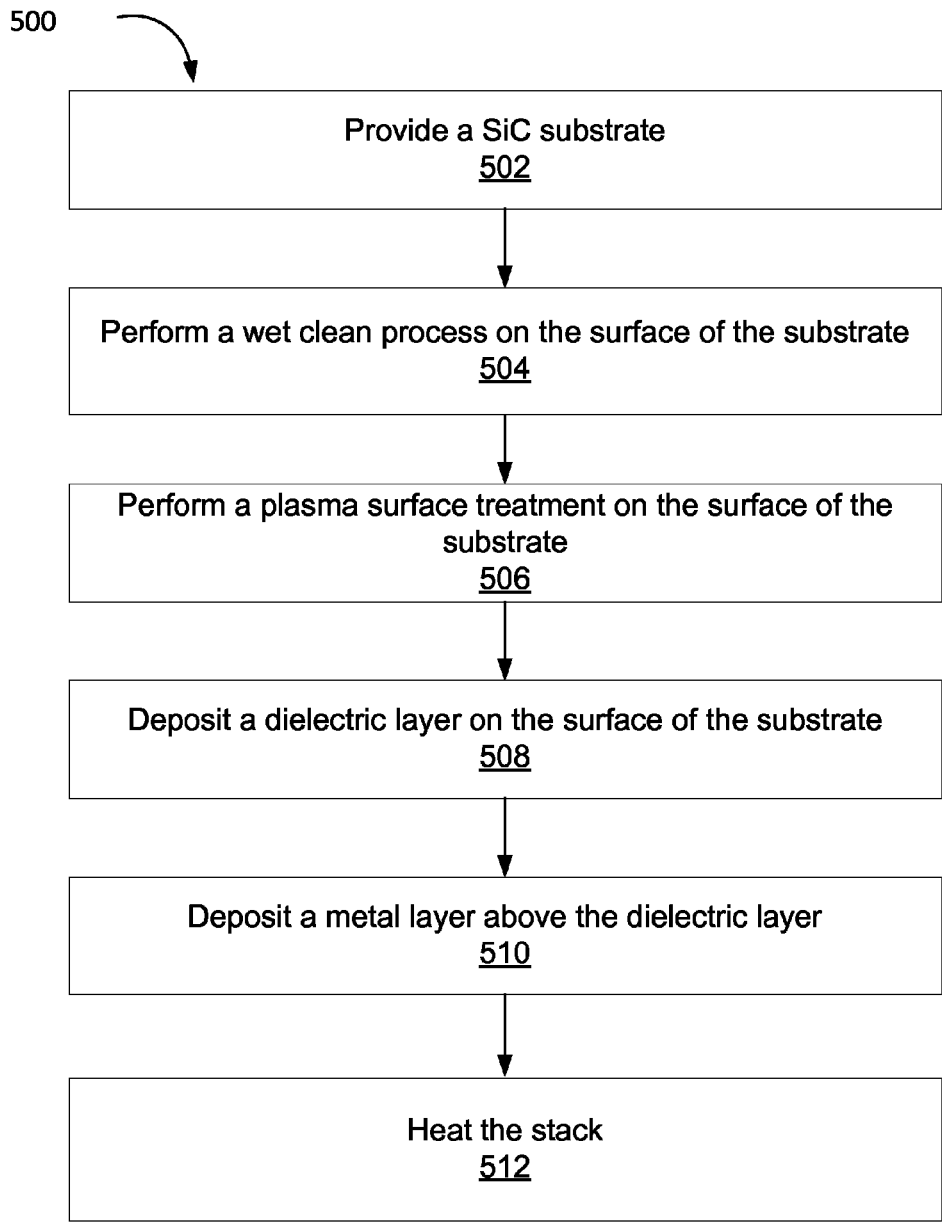
FIG. 5 illustrates a flow chart of methods according to some embodiments.

FIG. 5 illustrates a flow chart of methods according to some embodiments. In step 502, a substrate is provided. As discussed previously, the substrate may include silicon carbide. The semiconductor wafer shapes and sizes can vary and include commonly used round wafers of 50 mm, 100 mm, 150 mm, 200 mm, 300 mm, or 450 mm in diameter.

In step 504, a wet clean process is performed on the surface of the substrate. An example of a suitable wet cleaning process for SiC substrates includes a first step including exposing the substrate to a mixture of sulfuric acid and hydrogen peroxide. A second step involves applying an RCA clean solution to the surface of the substrate. The RCA clean may be followed by a final clean in a 1% hydrofluoric acid solution for about 60 seconds.

In step 506, a plasma surface treatment may be applied to the surface of the substrate after it has been placed into the process chamber. An example of a suitable plasma surface treatment includes the exposure of the surface of the substrate to activated species such as H* or N* to remove surface oxides and other contaminants. Gases used to generate the activated species may include at least one of hydrogen, nitrogen or ammonia, among others. The surface treatment may be applied in a process chamber such as described with respect to FIG. 3.

In step 508, a dielectric layer is deposited above the surface of the substrate. Advantageously, the dielectric layer is deposited on the surface without exposing the surface of the substrate to ambient air after the surface treatment and before the deposition of the dielectric layer. Examples of suitable dielectric layers include at least one of titanium oxide, zinc oxide, or indium gallium zinc oxide, among others. The dielectric layer will typically have a thickness of between about 1 nm and about 3 nm. The dielectric layer may be deposited using any common deposition process. In some embodiments, the dielectric layer is deposited using an ALD or a PEALD process. The dielectric layer deposition may be performed in a process chamber such as described with respect to FIG. 2.

In step 510, a metal or conductor layer having a low workfunction is deposited above the dielectric layer. Advantageously, the metal layer is deposited on the surface without exposing the surface of the substrate to ambient air after the deposition of the dielectric layer and before the deposition of the metal layer. Examples of low workfunction materials include titanium, titanium aluminum alloy, and titanium aluminum nitrogen alloy, among others. The metal layer may be deposited using any common deposition process. In some embodiments, the metal layer is deposited using a PVD process. The metal layer deposition may be performed in a process chamber such as described with respect to FIG. 4.

In step 512, the stack (e.g. substrate–dielectric layer–metal layer) is heated to a temperature in a range of about 400C to about 600C. Advantageously, the stack is heated to a temperature of about 500C. The heating may be performed in an atmosphere that includes forming gas (e.g. a mixture of volume % hydrogen in nitrogen).

The use of a low workfunction metal as the contact material to a clean SiC surface results in a good ohmic contact due to the small barrier height formed at the semiconductor-metal interface. The thin dielectric layer prevents the constituents of the semiconductor (i.e. silicon and carbon) from reacting with the constituents of the metal layer (i.e. titanium, aluminum, or nitrogen). Reactions between the semiconductor and the metal layer lead to the formation of compounds that may not be beneficial to the long term performance of the device. Therefore, proper selection of metal or metal alloy materials that do not react with the SiC semiconductor can lead to the formation of devices with improved reliability and durability.

Figure 6:
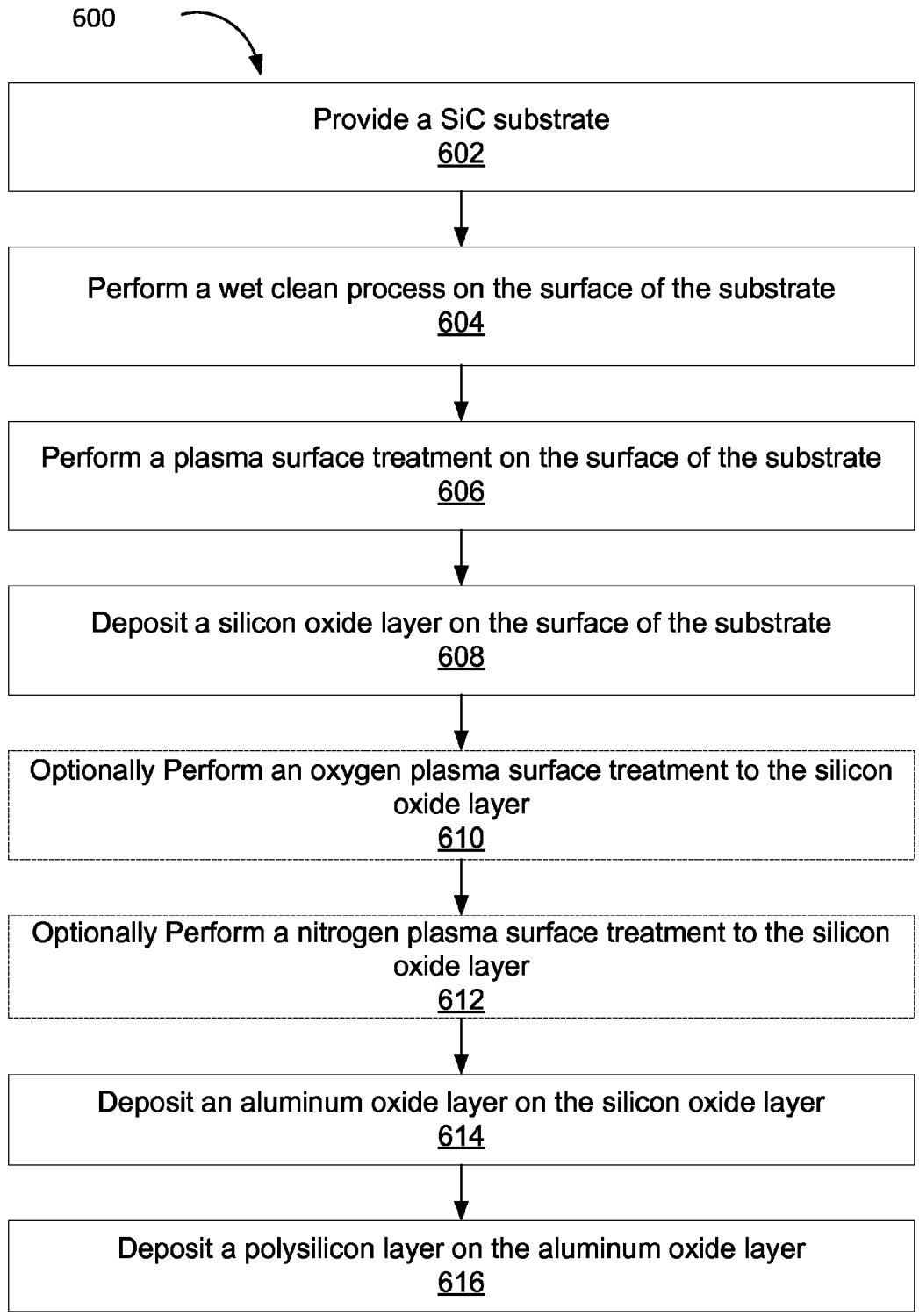
FIG. 6 illustrates a flow chart of methods according to some embodiments.

FIG. 6 illustrates a flow chart of methods according to some embodiments. In step 602, a substrate is provided. As discussed previously, the substrate may include silicon carbide. The semiconductor wafer shapes and sizes can vary and include commonly used round wafers of 50 mm, 100 mm, 150 mm, 200 mm, 300 mm, or 450 mm in diameter.

In step 604, a wet clean process is performed on the surface of the substrate. An example of a suitable wet cleaning process for SiC substrates includes a first step including exposing the substrate to a mixture of sulfuric acid and hydrogen peroxide. A second step involves applying an RCA clean solution to the surface of the substrate. The RCA clean may be followed by a final clean in a 1% hydrofluoric acid solution for about 60 seconds.

In step 606, a plasma surface treatment may be applied to the surface of the substrate after it has been placed into the process chamber. An example of a suitable plasma surface treatment includes the exposure of the surface of the substrate to activated species such as H* or N* to remove surface oxides and other contaminants. Gases used to generate the activated species may include at least one of hydrogen, nitrogen or ammonia, among others. In some embodiments, the plasma surface clean includes activated H* species to remove hydrocarbons and any remaining surface oxides from the surface. The surface treatment may be applied in a process chamber such as described with respect to FIG. 3.

In step 608, a silicon oxide dielectric layer is deposited above the surface of the substrate. Advantageously, the silicon oxide dielectric layer is deposited on the surface without exposing the surface of the substrate to ambient air after the surface treatment and before the deposition of the silicon oxide dielectric layer. The silicon oxide dielectric layer will typically have a thickness of between about 1 nm and about 2 nm. The silicon oxide dielectric layer may be deposited using any common deposition process. In some embodiments, the dielectric layer is deposited using an ALD or a PEALD process. Examples of suitable silicon precursors for the deposition of the silicon oxide include tris[dimethylamino]silane (3DMAS), bis(tertiary-butyl-amino)silane (BTBAS), trisilane, and $H_2Si[N(C_2H_5)_2]_2$, among others. Examples of suitable reactants for the deposition of the silicon oxide include ozone, water, or oxygen plasma, among others. The silicon oxide layer is typically deposited at a substrate temperature between about 50C and about 400C. The silicon oxide layer deposition may be performed in a process chamber such as described with respect to FIG. 2.

In step 610, an optional oxygen plasma surface treatment may be applied to the surface of the silicon oxide layer. Advantageously, the oxygen plasma surface treatment is applied to the surface without exposing the surface of the substrate to ambient air after the deposition of the silicon oxide dielectric layer. An example of a suitable oxygen plasma surface treatment includes the exposure of the surface of the substrate to activated species such as O* to remove oxygen vacancies, free carbon, and any other contaminants. Gases used to generate the activated species may include oxygen, or ozone, among others. The surface treatment may be applied in a process chamber such as described with respect to FIG. 3.

In step 612, an optional nitrogen plasma surface treatment may be applied to the surface of the silicon oxide layer. Advantageously, the nitrogen plasma surface treatment is applied to the surface without exposing the surface of the substrate to ambient air after the deposition of the silicon oxide dielectric layer. An example of a suitable nitrogen plasma surface treatment includes the exposure of the surface of the substrate to activated species such as N* to form an oxy-nitride material. Gases used to generate the activated species may include nitrogen, or nitrous oxide, among others. The surface treatment may be applied in a process chamber such as described with respect to FIG. 3. In some embodiments, both the oxygen plasma surface treatment and the nitrogen plasma surface treatment are applied to the surface of the silicon oxide dielectric layer.

In step 614, an aluminum oxide layer may be deposited above the silicon oxide layer. Advantageously, the aluminum oxide layer is deposited above the silicon oxide layer without exposing the substrate to ambient air after the deposition (and/or plasma surface treatment(s)) of the silicon oxide dielectric layer. The aluminum oxide layer may serve as a gate dielectric layer. The aluminum oxide layer typically has a thickness between about 5 nm and about 10 nm. The aluminum oxide layer may be deposited using any common deposition process. In some embodiments, the dielectric layer is deposited using an ALD or a PEALD process. An example of a suitable aluminum precursor for the deposition of the aluminum oxide includes trimethyl aluminum, among others. Examples of suitable reactants for the deposition of the aluminum oxide include ozone, water, or oxygen plasma, among others. The aluminum oxide layer deposition may be performed in a process chamber such as described with respect to FIG. 2. Alternatively, the aluminum oxide may be deposited by alternate processes such as metal organic chemical vapor deposition (MOCVD).

In step 616, a gate electrode layer is deposited on the aluminum oxide layer. Typically, the gate electrode layer includes doped polysilicon. The polysilicon layer may be deposited using known processes.

The use of the in-situ deposition of the silicon oxide layer may reduce the interface density at the semiconductor interface, leading to improved performance. The use of the in-situ oxygen plasma surface treatment may be effective to remove oxygen vacancies, free carbon, and any other contaminants. This is especially useful for removing the free carbon that may be present at the interface. The use of the in-situ nitrogen plasma surface treatment may be effective to form an oxy-nitride material. The nitridation of the silicon oxide dielectric layer will further reduce the density of interface states and improve the reliability of the silicon oxide dielectric layer.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method comprising:
   providing a semiconductor substrate,
      wherein the semiconductor substrate comprises silicon carbide;
   cleaning a surface of the semiconductor substrate,
      wherein the cleaning comprises a wet process;
   placing the semiconductor substrate in a process chamber and applying a plasma surface treatment to the surface of the semiconductor substrate;
   depositing a dielectric layer on the surface of the semiconductor substrate,
      wherein the dielectric layer is deposited in-situ after applying the plasma surface treatment such that the surface of the semiconductor substrate is not exposed to ambient air after the plasma surface treatment and before depositing the dielectric layer, and wherein the dielectric layer comprises an oxide;

depositing a metal layer above the dielectric layer; and heating the substrate.

2. The method of claim 1 wherein the cleaning comprises exposing the surface of the semiconductor substrate to at least one of a mixture of sulfuric acid and hydrogen peroxide, an RCA clean solution, or a 1 volume % hydrofluoric acid solution.

3. The method of claim 1 wherein the applying of the plasma surface treatment comprises exposing the surface of the substrate to activated species such as H* or N*.

4. The method of claim 3 wherein gases used in the applying of the plasma surface treatment comprise at least one of hydrogen, nitrogen, or ammonia.

5. The method of claim 1 wherein the metal oxide of the dielectric layer comprises one of titanium oxide, zinc oxide, or indium gallium zinc oxide.

6. The method of claim 5 wherein the dielectric layer is deposited using an atomic layer deposition process and has a thickness between 1 nanometer and 3 nanometers.

7. The method of claim 1 wherein the metal layer comprises one of titanium, titanium aluminum alloy, or titanium aluminum nitrogen alloy.

8. The method of claim 7 wherein the metal layer is deposited using a physical vapor deposition process.

9. The method of claim 1 wherein the heating of the substrate comprises heating the substrate to a temperature between 400C and 600C.

10. The method of claim 1 wherein the heating of the substrate comprises heating the substrate in an atmosphere comprising forming gas.

11. A method comprising:
providing a semiconductor substrate, wherein the semiconductor substrate comprises silicon carbide;
cleaning a surface of the semiconductor substrate, wherein the cleaning comprises a wet process;
placing the semiconductor substrate in a process chamber and applying a first plasma surface treatment to the surface of the semiconductor substrate;
depositing a first dielectric layer on the surface of the semiconductor substrate,
wherein the first dielectric layer is deposited in-situ after applying the first plasma surface treatment such that the surface of the semiconductor substrate is not exposed to ambient air after the first plasma surface treatment and before depositing the first dielectric layer, and
wherein the first dielectric layer comprises an oxide; and
depositing a second dielectric layer above the first dielectric layer.

12. The method of claim 11 wherein the cleaning comprises exposing the surface of the semiconductor substrate to at least one of a mixture of sulfuric acid and hydrogen peroxide, an RCA clean solution, or a 1 volume % hydrofluoric acid solution.

13. The method of claim 11 wherein the applying of the first plasma surface treatment comprises exposing the surface of the substrate to activated species such as H* or N*.

14. The method of claim 13 wherein gases used in the applying of the first plasma surface treatment comprise at least one of hydrogen, nitrogen, or ammonia.

15. The method of claim 11 wherein the metal oxide of the first dielectric layer comprises silicon oxide.

16. The method of claim 15 wherein the first dielectric layer is deposited using an atomic layer deposition process and a silicon precursor used in the atomic layer deposition process comprises one of tris[dimethylamino]silane (3DMAS), bis(tertiary-butyl-amino)silane (BTBAS), trisilane, or $H_2Si[N(C_2H_5)_2]_2$.

17. The method of claim 11 wherein the second dielectric layer comprises aluminum oxide.

18. The method of claim 17 wherein the second dielectric layer is deposited using an atomic layer deposition process and an aluminum precursor used in the atomic layer deposition process comprises trimethyl aluminum.

19. The method of claim 11 further comprising applying a second plasma surface treatment after the depositing of the first dielectric layer, wherein the second plasma surface treatment comprises exposing the surface of the substrate to activated species such as O*.

20. The method of claim 11 further comprising applying a third plasma surface treatment after the depositing of the first dielectric layer, wherein the third plasma surface treatment comprises exposing the surface of the substrate to activated species such as N*.

\* \* \* \* \*